United States Patent [19]

Takeuchi et al.

[11] Patent Number: 5,023,700
[45] Date of Patent: Jun. 11, 1991

[54] MINUTELY PATTERNED STRUCTURE

[75] Inventors: Yukihisa Takeuchi; Tetsuo Watanabe; Azuma Yamamoto, all of Nagoya; Kazuo Shirakawa; Takao Segawa, both of Tokyo, all of Japan

[73] Assignees: NGK Insulators, Ltd.; Toppan Printing Co., Ltd., Japan

[21] Appl. No.: 367,257

[22] Filed: Jun. 16, 1989

[30] Foreign Application Priority Data

| Jun. 17, 1988 | [JP] | Japan | 63-150885 |
| Jul. 8, 1988 | [JP] | Japan | 63-171099 |
| Jul. 8, 1988 | [JP] | Japan | 63-171100 |
| Apr. 27, 1989 | [JP] | Japan | 1-108091 |

[51] Int. Cl.$^5$ ............ H01L 23/48; H01L 29/44; H01L 29/52; H01L 29/60
[52] U.S. Cl. ............ 357/70; 357/65; 357/68; 357/69; 357/71; 361/421; 439/65; 439/68; 439/72; 29/592.1; 346/76 PH; 346/139 C; 428/573
[58] Field of Search ............ 357/70, 71, 65, 68, 357/69; 361/421; 439/65, 68, 72; 174/72 B; 29/592.1; 346/76 PH, 139 C; 428/573, 574, 575

[56] References Cited

U.S. PATENT DOCUMENTS

| 3,968,500 | 7/1976 | Meisel et al. | 346/139 C |
| 4,082,619 | 4/1978 | Dehnert et al. | 204/15 |
| 4,510,017 | 4/1985 | Barber | 156/651 |
| 4,651,191 | 3/1987 | Oove et al. | 357/71 |
| 4,684,960 | 8/1987 | Nishiwaki | 346/76 PH |
| 4,720,908 | 1/1988 | Wills | 437/192 |
| 4,733,292 | 3/1988 | Jarvis | 357/70 |
| 4,814,855 | 3/1989 | Hodgson | 174/52.4 |
| 4,831,425 | 5/1989 | Pals et al. | 357/24 |

FOREIGN PATENT DOCUMENTS

| 51-40869 | 4/1976 | Japan . |
| 58-90752 | 5/1983 | Japan . |
| 60-92646 | 5/1985 | Japan . |
| 60-103652 | 6/1985 | Japan . |
| 60-107848 | 6/1985 | Japan . |
| 60-206144 | 10/1985 | Japan . |
| 60-227457 | 11/1985 | Japan . |
| 62-81739 | 4/1987 | Japan . |

*Primary Examiner*—Rolf Hille
*Assistant Examiner*—David Ostrowski
*Attorney, Agent, or Firm*—Parkhurst, Wendel & Rossi

[57] ABSTRACT

A patterned structure including a plurality of patterned sheet members which have respective configurations and which are partially superposed on each other and which cooperate with each other to define a plurality of voids. At least one of the sheet members includes a thin-walled portion whose thickness is smaller than a thickness of the other portion. The thin-walled portion is formed by etching the appropriate sheet member or members. The thin-walled portion of one sheet member engages the corresponding thin-walled portion or the other portion of the other sheet member or members.

10 Claims, 7 Drawing Sheets

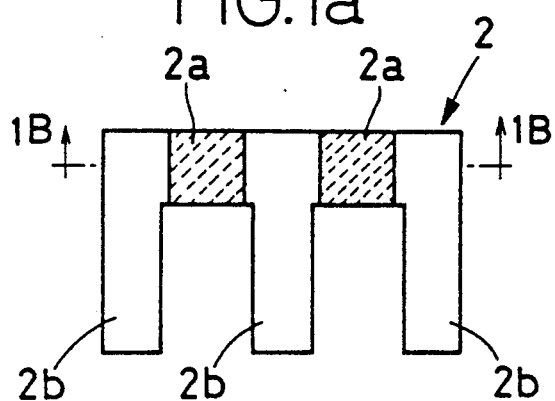
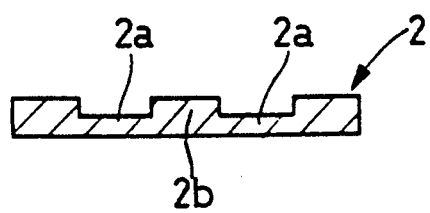
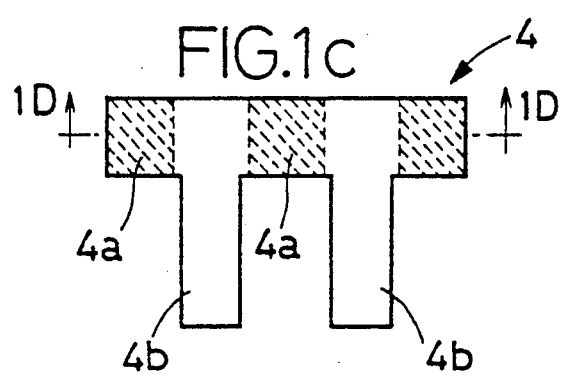
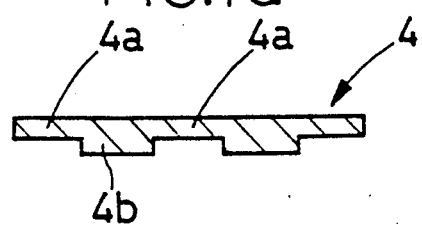
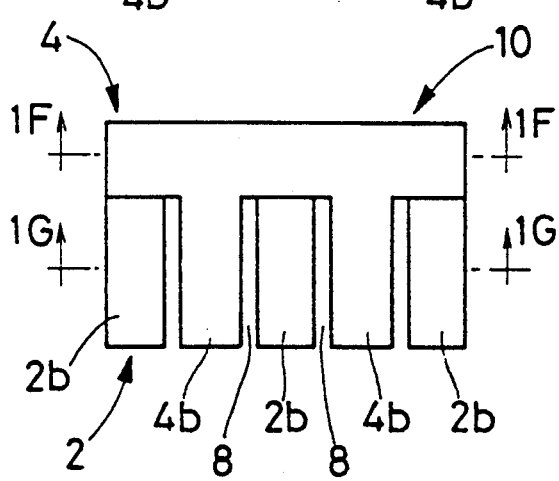
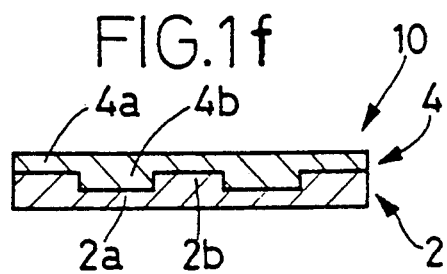
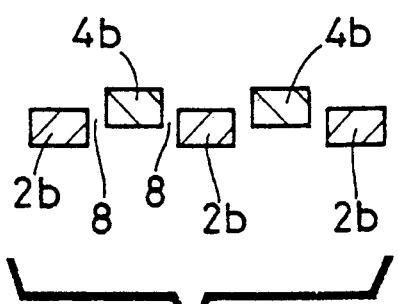

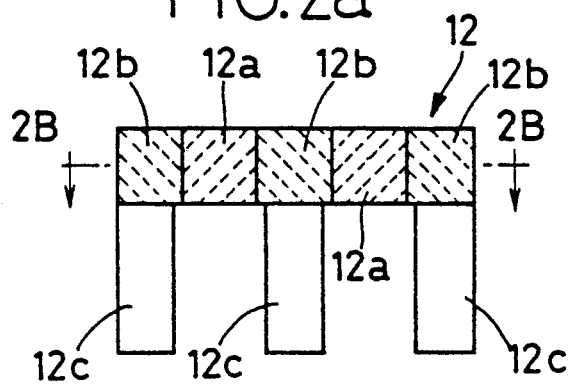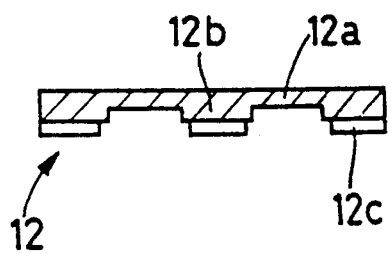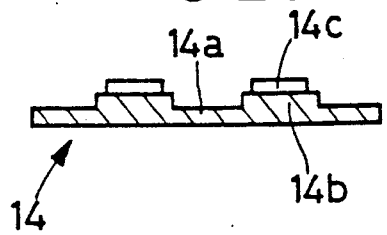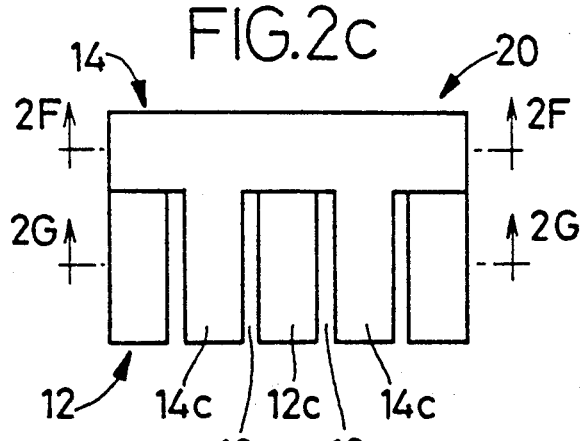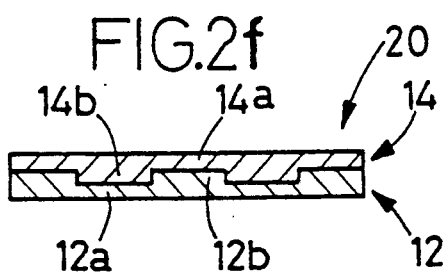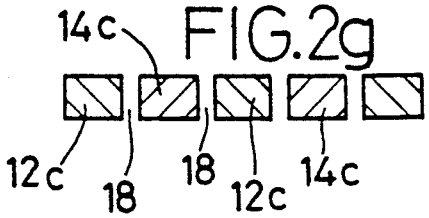

MINUTELY PATTERNED STRUCTURE

BACKGROUND OF THE INVENTION

1. Field of the Invention

The present invention relates to a patterned structure having minute slits, openings or other voids whose aspect ratio (ratio of the diameter or width to the thickness, i.e., diameter/thickness or width/thickness) is smaller than 1, and a method of producing such a minutely patterned structure.

2. Discussion of the Prior Art

Patterned structures having extremely small slits, openings or other voids, particularly, such patterned structures made of a metallic material, have been used as electrical lead frames for LSI packages, and as various masking members, for example. Techniques for fabricating a double-layer or bi-plane lead frame or similar product from two members, with improved density of the wiring formed thereon, are known according to various publications such as laid-open Publications 58-90752, 60-92646, 60-103652, 60-107848, 60-206144, 60-227457 and 62-81739 of unexamined Japanese patent applications. Generally, these techniques of fabrication utilize press-forming or etching methods. These methods are difficult to be practiced for forming slits, openings or other voids which have a small aspect ratio. Conventionally, therefore, the voids having a small aspect ratio are formed by ion-milling or laser-cutting methods.

Another technique for producing a patterned structure is disclosed in laid-open Publication 51-40869, wherein a plurality of thin sheets having the same configurations are superposed on each other to form a planar patterned assembly having a desired thickness.

However, such a planar patterned structure as indicated above suffers from extreme difficulty in precisely positioning the two or more sheets relative to each other, and therefore cannot provide a sufficiently high degree of dimensional or configurational accuracy of the formed pattern. Further, the thickness of the patterned structure is determined by the total thickness of the constituent sheets that are superposed on each other. Where the patterned structure has a portion or portions whose thickness should be accurately controlled, the desired thickness accuracy cannot be easily obtained. In the case of an electrical lead frame, the thickness or volume of resin, ceramic or other sealing materials increases with the thickness of the structure, i.e., total thickness of the constituent sheets. In this case, the heat dissipation characteristic of the lead frame is accordingly deteriorated.

On the other hand, the conventional ion-milling and laser-cutting methods do not permit sufficient efficiency in forming the voids, and may cause damage to the portions of the workpieces which should be kept intact. Further, these methods require extremely expensive equipment. If the workpiece sheet is reduced to reduce the width of the slits or the diameter of the openings, the strength and the uniformity of thickness of the prepared patterned structure tend to be reduced, and the patterned structure cannot be easily processed for practical application. Thus, the ion-milling and laser-cutting methods suffer from drawbacks in terms of the process to form the voids in the structure, and the physical properties and the dimensional and configurational accuracy of the structure.

In the alternative known method which uses two or more sheets having the same configuration to prepare a patterned structure, it is considerably difficult to establish precise alignment of the sheets relative to each other for accurate dimensioning of the pattern. Further, since the thickness of the patterned structure is determined by the total thickness of the sheets superposed on each other, it is difficult to precisely control the thickness of the desired local portions of the structure.

SUMMARY OF THE INVENTION

The present invention was developed in view of the prior art situation described above. It is therefore a first object of the invention to provide a patterned structure which has accurately dimensioned openings, slits or other voids whose aspect ratio is relatively small.

A second object of the invention is to provide a comparatively simple method suitable for producing the patterned structure, with relatively simple equipment.

The first object may be attained according to one aspect of the invention, which provides a patterned structure comprising a plurality of patterned sheet members which are partially superposed on each other and which cooperate with each other to define a plurality of voids. The patterned sheet members have respective areas at which the sheet members are superposed on each other. At least a part of the area of at least one of the patterned sheet members includes a thin-walled portion whose thickness is smaller than a thickness of the other portion of the at least one patterned sheet member.

The second object may be attained according to another aspect of the present invention, which provides a method suitable for producing a patterned structure, which comprises the steps of: preparing a plurality of patterned sheet members having predetermined configurations or shapes; forming a thin-walled portion on at least one of the patterned sheet members such that a thickness of the thin-walled portion is smaller than a thickness of the other portion of the above-indicated at least one patterned sheet member; and superposing the patterned sheet members on each other such that at least the thin-walled portion of each of the above-indicated at least one patterned sheet member engages the corresponding thin-walled portion or the other portion of the other patterned sheet member or members.

According to the present invention, the plurality of patterned sheet members, preferably made of a metallic material, are first prepared so as to have desired outer configurations or profiles, depending upon a desired shape of a patterned structure to be produced. These patterned sheet members may be formed by various known methods such as press-forming and ultrasonic cutting methods, and the methods for forming the sheet members are not bound by the specific patterned structure to be produced. However, the patterned sheet members may be most preferably formed by an etching method which uses etching masks. The etching process is less likely to cause a residual strain in the etched workpiece sheets, and assures high degree of dimensional and configurational accuracy of the sheets. For example, the etching masks may consist of a resist which is resistant to an etching solution and which is suitably patterned by a photolithographic or precision-printing technique.

Then, at least a part of the surface area of at least one of the patterned sheet members is subjected to an operation to reduce its thickness. Namely, a thin-walled portion or portions is/are formed at a desired part or parts of the sheet member or members. The patterned sheet members are superposed on each other such that each thin-walled portion of one of the sheet members is in contact with the corresponding thin-walled portion or the other portion of the other sheet member or members. However, all the thin-walled portions of the patterned structure need not be provided on only one of the sheet members. Some of the thin-walled portions may be provided on one of the sheet members, while the other thin-walled portions may be provided on the other sheet member or members.

The thin-walled portions may be advantageously formed by suitable known wet or dry etching operations. The desired thicknesses of the thin-walled portions are established by suitably determining or adjusting the etching conditions. The non-etched portions (other thick-walled portions) of the sheet member or members are covered by suitably patterned resist masks formed by a photolithographic, precision-printing or other method. Thus, the material is removed by etching from the appropriate parts of the sheet member or members, to form the thin-walled portions, such that a portion of the thickness of the sheet member or members is reduced. This etching to partially remove the material from the sheet members will be referred to as "half etching".

Where the patterned sheet members are patterned by etching, the "half etching" to form the thin-walled portions may be effected concurrently, by masking only one of the opposite surfaces of the sheet member so as to cover the appropriate local areas by a resist. It is also possible to first effect the half etching on at least one of the sheet members, and subsequently effect an operation for establishing the desired outer profiles of the sheet members.

While the thin-walled portions may be formed on only one of the sheet members, it is preferable that each sheet member has the thin-walled portion or portions, so that the thin-walled portions of the different sheet members are held in contact with each other.

Where the two or more thin-walled portions are provided on each of the patterned sheet members, it is desirable that these thin-walled portions have different thicknesses. In the case where a planar patterned structure is prepared by superposing two patterned sheet members on each other, for example, each of the first and second sheet members has a first thin-walled portion having a thickness which is one third of the sheet thickness, and a second thin-walled portion having a thickness which is two thirds of the sheet thickness. In this case, the first and second sheet members are assembled such that the first thin-walled portion of the first sheet member and the second thin-walled portion of the second sheet member are in contact with each other, while the second thin-walled portion of the first sheet member and the first thin-walled portion of the second sheet member are in contact with each other.

The patterned structure according to the present invention may be used without securing the constituent sheet members to each other. However, the sheet members may be bonded together by suitable means such as an adhesive agent, spot welding or ultrasonic welding, in order to avoid separation of the sheet members. The patterned structure has a surface area at which the sheet members are superposed on each other. Sometimes, this surface area includes a part whose thickness should not consist of the thicknesses of the two or more sheet members. In this case, the part in question should not include a thin-walled portion. Alternatively, the thin-walled portion or portions is/are provided on appropriate dummy portions of the sheet members, so that these dummy portions are cut off after the sheet members are assembled into the patterned sheet structure. All the portions of the patterned structure at which the sheet members are superposed on each other need not include a thin-walled portion or portions. That is, the sheet member or members may include a bent or folded part or parts at which the sheet members engage each other. Further, the thin-walled portions of the sheet members may be provided only at those parts or areas of the patterned structure at or by which the sheet members are positioned relative to each other, or at which the appropriate portions of the sheet members lie in the same plane.

The half etching to form the thin-walled portions of the patterned sheet members according to the method of the invention as described above results in reduced residual strain of the sheet members and improved dimentional and configurational accuracy of the patterned structure, as compared with the conventional press-forming or other mechanical methods. Further, the half etching method according to the invention facilitates controlling the thicknesses of the patterned structure, reduces nicks and burrs or undesired raised areas, consists of a comparatively small number of process steps, and requires relatively simple equipment.

The patterned structure constructed according to the invention has improved accuracy of positioning of the two or more sheet members relative to each other, owing to the engagement of the thin-walled portion or portions of one or more of the sheet members, with the corresponding portion or portions of the other sheet member or members. The patterned structure may be suitably provided in the form of a planar structure, which has suitably located minute openings, holes, slits or other voids having a small aspect ratio that cannot be obtained on a conventional patterned structure which is prepared from a single sheet member.

Where each of the plurality of sheet members has the thin-walled portion or portions so that the thin-walled portions of the different sheet members are in contact with each other, the total thickness of the superposed thin-walled portions can be substantially equal to the thickness of each sheet member. In this case, the superposed thin-walled portions may lie in the same plane as the other portions (non-superposed or comparatively thick-walled portions).

In the case where each of the sheet members has two or more thin-walled portions having different thicknesses, the thin-walled portions may engage each other without increasing the total thickness of the superposed thin-walled portions. For instance, the relatively thick first thin-walled portion of a first sheet member contacts the relatively thin second thin-walled portion of another sheet member, while the relatively thin second thin-walled portion of the first sheet member contacts the relatively thick first thin-walled portion of the second sheet member, such that the prepared patterned structure has the total thickness of the first and second thin-walled portions which is equal to the nominal thickness of the sheet members, i.e., thickness of the other portions of the sheet members.

It will be understood from the foregoing description that the present invention provides a precisely patterned structure which has accurately dimensioned minute voids such as openings, holes or slits whose aspect ratio is comparatively small. The patterned structure may be suitably used as various electrical lead frames, masking members, circuit boards, electrode assemblies, terminal assemblies, connector assemblies, and filter assemblies. Thus, the present invention is industrially significant.

BRIEF DESCRIPTION OF THE DRAWINGS

The above and optional objects, features and advantages of the present invention will be better understood by reading the following description of presently preferred embodiments of the invention, when considered in conjunction with the accompanying drawings, in which:

FIGS. 1(a) through 1(g) are explanatory views schematically illustrating one form of a patterned structure and a method for producing the same, according to one embodiment of the invention, FIGS. 1(a), 1(c) and 1(e) being plan views of a first patterned sheet member, a second patterned sheet member, and the patterned structure, respectively, FIGS. 1(b), 1(d), 1(f) and 1(g) being cross sectional views taken along lines B—B, D—D, F—F and G—G of FIGS. 1(a), 1(c) and 1(e), respectively;

FIGS. 2(a) through 2(g) are explanatory views showing another embodiment of the invention, FIGS. 2(a), 2(c) and 2(e) being plan views of a first and a second sheet member, and a patterned structure, respectively, FIGS. 2(b), 2(d), 2(f) and 2(g) being cross sectional views taken along lines B—B, D—D, F—F and G—G of FIGS. 2(a), 2(c) and 2(e), respectively;

DESCRIPTION OF THE PREFERRED EMBODIMENTS

Figure 3A:
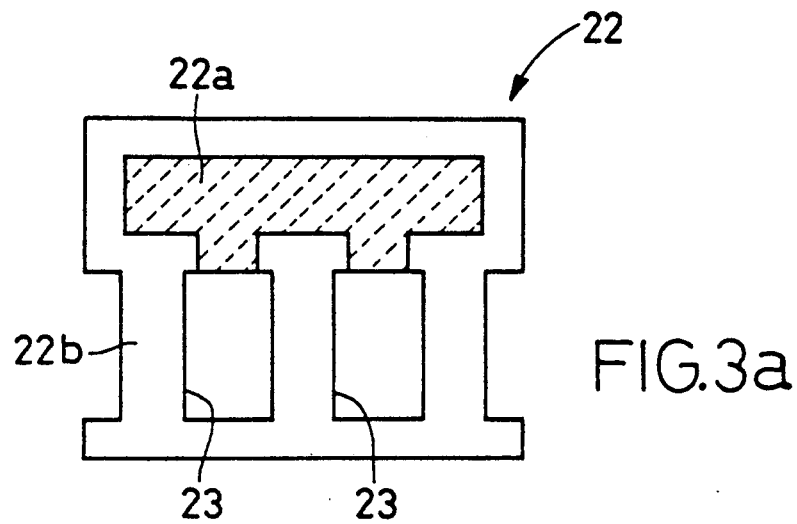
FIGS. 3(a), 3(b) and 3(c) are explanatory views schematically illustrating a patterned structure and a method according to a further embodiment of the invention, wherein only one of two metal sheet members is provided with thin-walled portions, FIGS. 3(a) and 3(b) being plan views of the first and second sheet members, and FIG. 3(c) being a plan view of the patterned structure.

To further clarify the concept of the present invention, the presently preferred embodiments of the invention will be described. It is to be understood that the invention is not limited to the details of the illustrated embodiments.

It is also to be understood that the invention may be embodied with various changes, modifications and improvements, which may occur to those skilled in the art, without departing from the spirit of the invention.

Referring first to FIGS. 1(a)–1(g), reference numeral 2 denotes a first patterned sheet member which is prepared from a metallic sheet. The first sheet member 2 has a generally comb-like configuration whose outer profile is formed by etching, as indicated in FIGS. 1(a) and 1(b). The patterned sheet member 2 has two mutually spaced-apart thin-walled portions 2a, and three non-etched portions 2b (thick-walled portions) in the form of elongate strips of the comb-like configuration. The non-etched portions 2b are spaced apart from each other in the direction of their width. The thin-walled portions 2a have a thickness which is one half of the nominal thickness of the sheet member 2 (i.e., one half of the thickness of the non-etched portions 2b). A second patterned sheet member 4 is prepared from another metallic sheet having the same thickness as that of the first patterned sheet member 2. As shown in FIGS. 1(c) and 1(d), the second sheet member 4 has three thin-walled portions 4a and two non-etched or thick-walled portions 4b, which are located differently from the portions 2a, 2b of the first sheet member 2. The non-etched portions 4b are spaced apart from each other in the direction of their width. The thin-walled portions 4a also have a thickness which is one half of the nominal thickness of the sheet member 4. The first and second patterned sheet members 2 and 4 are partially superposed on each other such that the thin-walled portions 2a and 4a engage or contact the non-etched portions 4b and 2b, respectively, so as to accurately position the two sheet members 2, 4 relative to each other, as indicated in FIGS. 1(e), 1(f) and 1(g). Thus, the two sheets 2, 4 are assembled together into a patterned structure 10, wherein the two sheets 2, 4 cooperate with each other to define a plurality of elongate rectangular voids in the form of slits 8 having a very small width.

As is seen from FIG. 1(g), the thus prepared minutely patterned structure, which has a generally planar shape, has an overall thickness which is about 1.5 times as large as the nominal thickness of the patterned sheet members 2, 4.

Referring next to FIGS. 2(a)–2(g), there is shown another embodiment of this invention. This embodiment uses a first and a second patterned sheet member 12, 14 which have the same outer profiles as the corresponding first and second sheet members 2, 4 of the preceding embodiment. Unlike the sheet members 2, 4, however, the sheet members 12 and 14 have first thin-walled portions 12a, 14a, and second thin-walled portions 12b, 14b, respectively. These first and second thin-walled portions 12a, 14a, and 12b, 14b have different thicknesses. More specifically, the thickness of the first thin-walled portions 12a, 14a is one third of the nominal thickness of the sheet members 12, 14, i.e., one third of non-etched or thick-walled portions 12c, 14c of the sheets, while the thickness of the second thin-walled portions 12b, 14b is two thirds of the nominal thickness of the sheet members 12, 14. The non-etched portions 12c of the sheet 12 are spaced apart from each other in the direction of their width, and the non-etched portions 14c of the sheet 14 are also spaced apart from each other in the direction of their width.

The first and second patterned sheet members 12, 14 are superposed on each other such that the first thin-walled portions of one of the two sheet members engage or contact the second thin-walled portions of the other sheet member. Thus, a patterned structure 20 is prepared from the two sheet members 12, 14, as shown in FIGS. 2(e)-2(g). In this embodiment, the overall thickness of the patterned structure 20 is substantially equal to the nominal thickness of the component sheet members 12, 14, as indicated in FIG. 2(g).

Figure 3B:
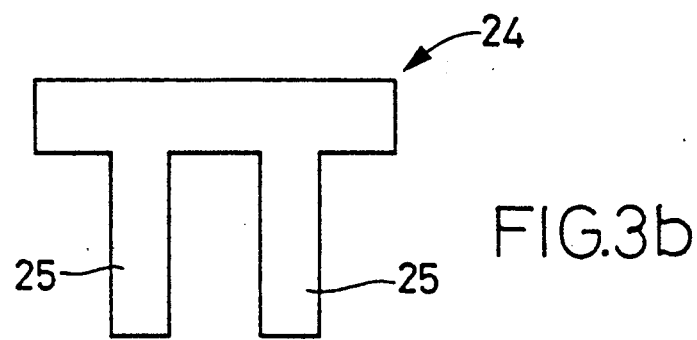
Figure 3C:
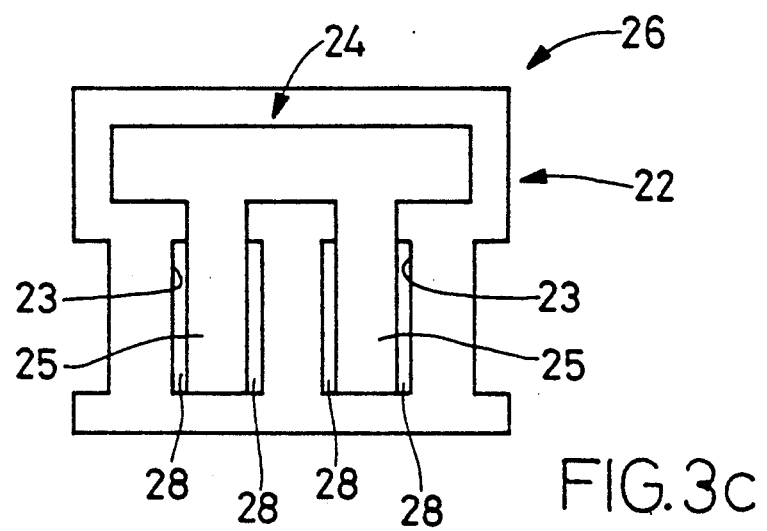

Reference is now made to FIGS. 3(a), 3(b) and 3(c) which show a further modified embodiment of the invention, in which only one of two patterned sheet members 22, 24, namely, only the sheet member 22 has a thin-walled portion 22a. The first sheet member 22 is prepared from a metallic sheet. The metallic sheet is first etched such that the etched sheet has an outer profile as shown in FIG. 3(a). Then, the etched metallic sheet is subjected to an etching operation so as to form the thin-walled portion 22a whose thickness is one half of the nominal thickness of the metallic sheet. Thus, the first patterned sheet member 22 is produced, with two rectangular cutouts 23 formed therethrough in the first etching of the metallic sheet such that each cutout 23 is defined by two adjacent non-etched strip portions 22b which are spaced apart from each other in the direction of their width. These cutouts 23 cooperate with strip portions 25 of the second patterned sheet member 24 to define a plurality of elongate rectangular voids in the form of slits 28 which will be described.

The second patterned sheet member 24 is prepared from another metallic sheet, so that the sheet member 24 having the strips 25 has an outer profile as shown in FIG. 3(b). The first and second patterned sheet members 22, 24 are superposed on each other such that the portion of the second sheet member 24 from which the strips 25 extend is in contact with the thin-walled portion 22a of the first sheet member 22, and such that the cutouts 23 of the first sheet member 22 cooperate with the strips 25 of the second sheet member 24 to define the slits 28 indicated above. Thus, the two sheet members 22, 24 are assembled together into a patterned structure 26 having the narrow slits 28, as shown in FIG. 3(c). The slits 28 are formed on opposite sides of each strip 25 of the second sheet member 24 which is aligned with the longitudinal centerline of the corresponding elongate cutout 24 of the first sheet member 22.

Figure 4A:
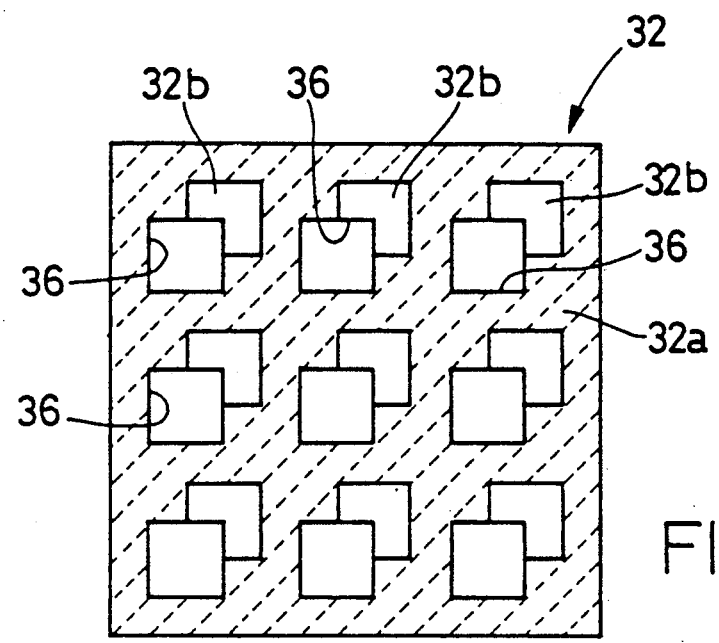
FIGS. 4(a), 4(b) and 4(c) are explanatory views schematically illustrating a patterned structure having openings whose aspect ratio is relatively small, and a method for producing the same, according to a still further embodiment of the invention, FIGS. 4(a) and 4(b) being plan views of a first and a second sheet member, and FIG. 4(c) being a plan view of the patterned structure.
Figure 4B:
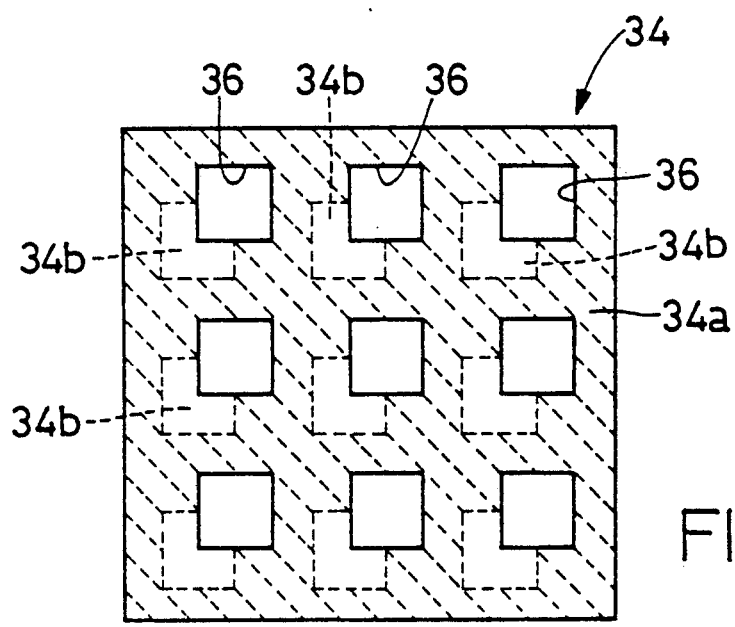
Figure 4C:
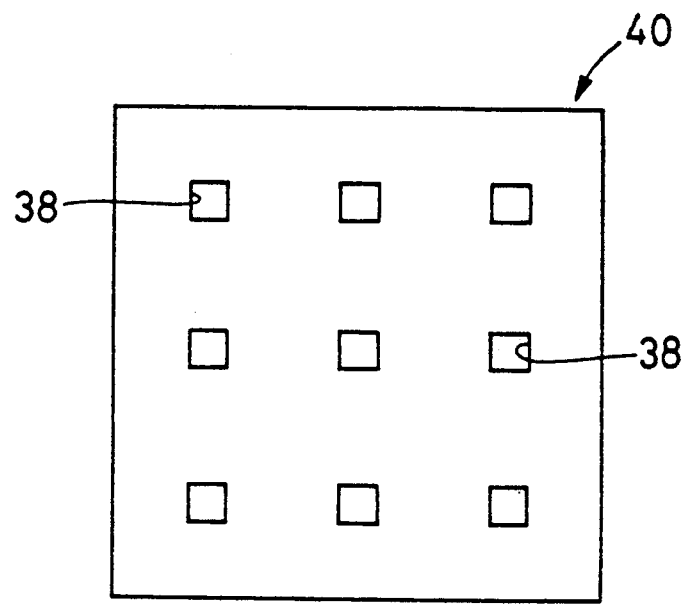

Referring next to FIGS. 4(a)-4(c), there is illustrated a still further embodiment of the present invention which uses a first and a second patterned sheet member 32, 34. Each of these two sheet members 32, 34 is prepared by etching from a single metallic sheet. Both of the sheet members 32, 34 have a plurality of rectangular cutouts 36 having a relatively large size. The first sheet member 32 has an etched thin-walled portion 32a, and a plurality of non-etched or thick-walled portions 32b which overlap the cutouts 36. Similarly, the second sheet member 34 has an etched thin-walled portion 34a, and a plurality of non-etched or thick-walled portions 34b overlapping the cutouts 36. The thickness of the thin-walled portions 32a, 34a is one half of the nominal thickness of the sheet members 32, 34.

These first and second patterned sheet members 32, 34 are superposed on each other such that the non-etched portions 32b of the first sheet member 32 are fitted in the respective cutouts 36 of the second sheet member 34 while the non-etched portions 34b of the second sheet member 34 are fitted in the respective cutouts 36 of the first sheet member 32. Further, the thin-walled portions 32a, 34a of the two sheet members 32, 34 are held in contact with each other. As a result, there is produced a planar patterned structure 40 having an array of small rectangular openings or voids 38 which are spaced apart from each other.

Figure 5A:
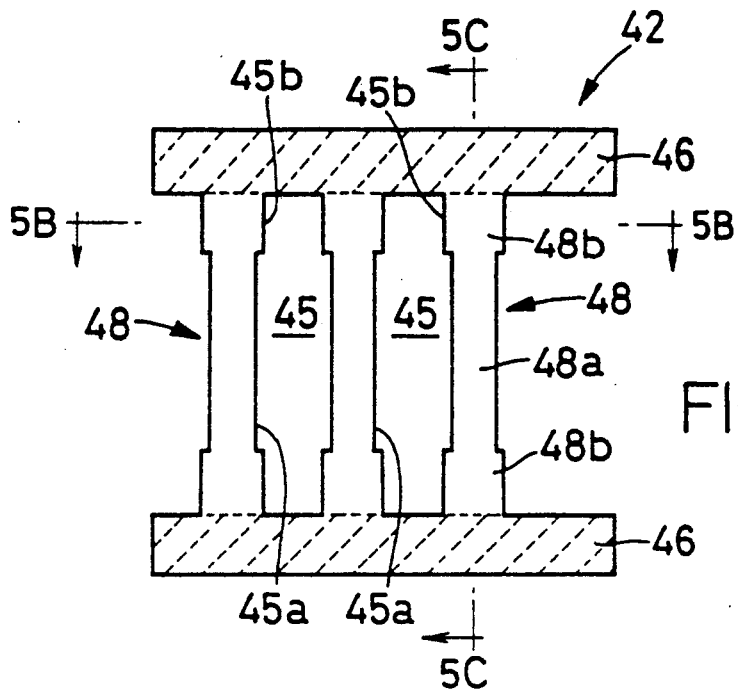
FIGS. 5(a) and 5(d) are explanatory plan views of still further forms of the electrically conductive sheets according to a still further embodiment of the invention.
Figure 5B:
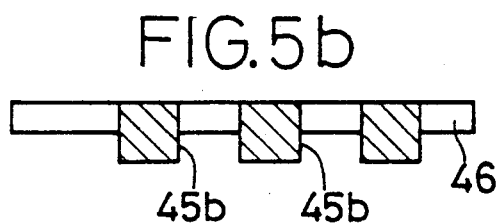
FIGS. 5(b) and 5(c) are cross sectional views taken along lines B—B and C—C of FIG. 5(a), respectively.
Figure 5C:
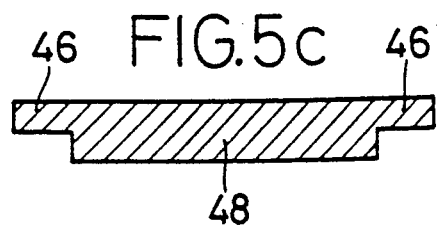
Figure 5D:
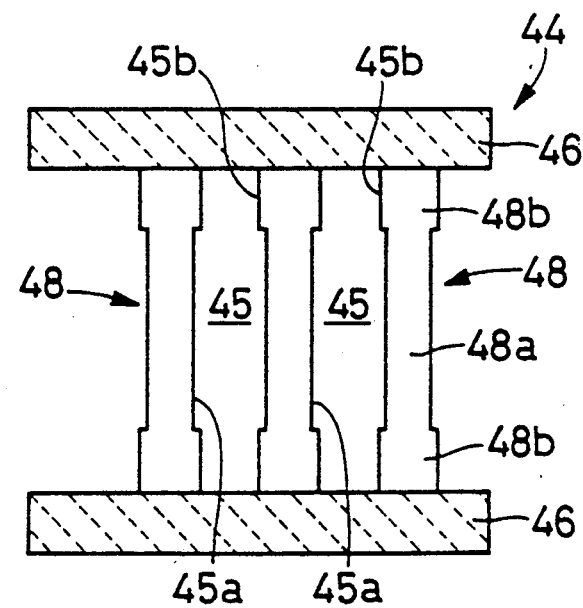
Figure 5E:
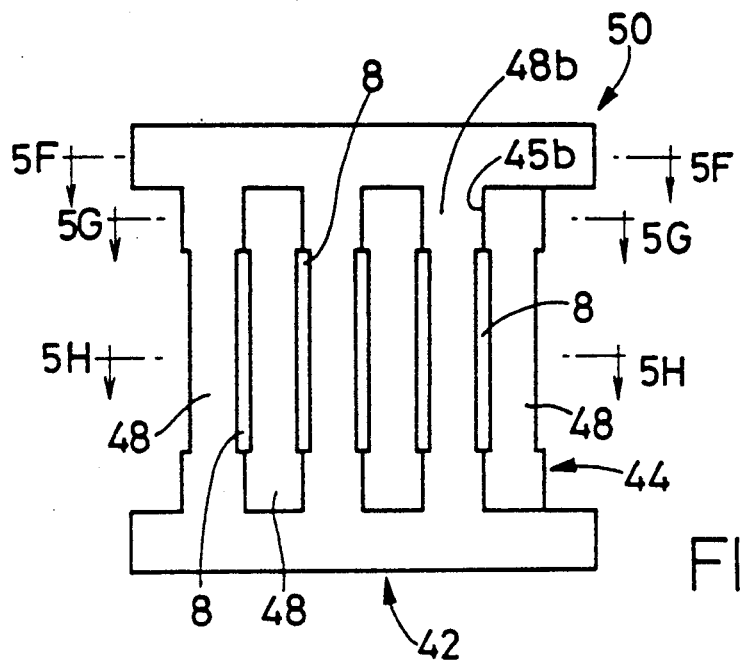
FIG. 5(e) is an explanatory plan view showing an electrode assembly prepared by superposing the two conductive sheets of FIGS. 5(a)–5(d) on each other.
Figure 5F:
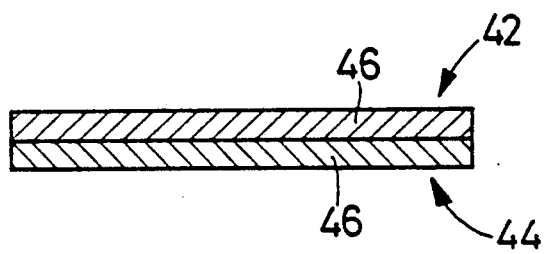
FIGS. 5(f), 5(g) and 5(h) are cross sectional views taken along lines F—F, G—G and H—H of FIG. 5(e), respectively.
Figure 5G:
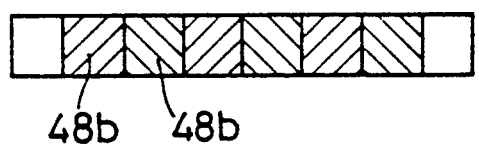
Figure 5H:
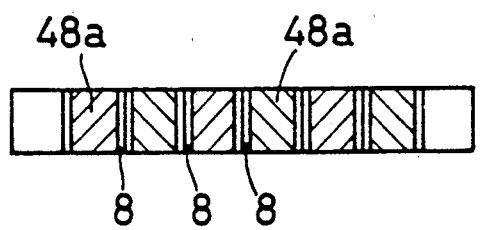

A still further modified embodiment of the invention is illustrated in FIGS. 5(a) through 5(h), wherein each of two stainless steel sheets 42, 44 as electrically conductive sheets has mutually spaced-apart apertures 45, each of which have length portions which have different widths. Described more specifically, the apertures 45 and thin-walled portions 46 are formed in each stainless steel sheet 42, 44, by an etching operation, as in the preceding embodiments. Each aperture 45 has a relatively wide central portion 45a, and relatively narrow opposite end portions 45b, 45b on both sides of the central portion 45a. The ends of the opposite end portions 45b are defined by the thin-walled portions 46. As a result, the apertures 45 define a plurality of mutually spaced-apart, generally elongate electrode portions 48, each of which has a relatively narrow central portion 48a, and relatively wide opposite end portions 48b, 48b which terminate in the thin-walled portions 46. The width of the relatively narrow end portions 45b of the aperture 45 is made equal to that of the relatively wide end portions 48b of the electrode portion 48. The thickness of the thin-walled portions 46 is one half of the thickness of the electrode portions 48. The two stainless steel sheets 42, 44 are superposed on each other such that the wide end portions 48b of the electrode portions are snugly fitted in the corresponding narrow end portions 45b of the apertures 45, whereby an electrode assembly 50 as shown in FIG. 5(e) is prepared.

What is claimed is:

1. A patterned structure comprising a plurality of patterned sheet members each of which has a plurality of strip portions spaced apart from each other in a direction of a width thereof, said patterned sheet members being partially superposed on each other such that said strip portions of said patterned sheet members cooperate with each other to define a plurality of volts, and such that said strip portions of said patterned sheet members are separated from each other by said voids, said patterned sheet members having respective areas at which the sheet members are superposed on each other, at least a part of the area of at least one of said patterned sheet members including a thin-walled portion whose thickness is smaller than a thickness of the other portion of said at least one patterned sheet member.

2. A patterned structure according to claim 1, wherein each of said patterned sheet members has said thin-walled portion, the thin-walled portions of said patterned sheet members are superposed on each other.

3. A patterned structure according to claim 1, wherein said other portion of said at least one patterned sheet member includes said plurality of strip portions, said strip portions of one of said at least one patterned sheet member partially overlapping said strip portions of another of said at least one patterned sheet member, when viewed in a direction of thickness of said at least one patterned sheet member such that said patterned structure has a thickness which is substantially greater than said thickness of said strip portions.

4. A patterned structure according to claim 1, wherein said other portion of said at least one patterned sheet member includes said plurality of strip portions, said patterned structure having a thickness substantially equal to said thickness of said other portion of the patterned sheet members strip portions.

5. A patterned structure according to claim 1, which is a lead frame having a plurality of electrical lead portions each of which includes at least a part of a corresponding one of said strip portions of said patterned sheet members.

6. A patterned structure according to claim 1, wherein each of said plurality of strip portions of said patterned sheet members consists of a generally elongate strip.

7. A patterned structure according to claim 6, wherein each of said plurality of voids consists of a slit having a width smaller than said thickness of said strip portions.

8. A patterned structure comprising a plurality of patterned sheet members each of which has a plurality of cutouts, said patterned sheet members being partially superposed on each other such that said cutouts of one of said patterned sheet members partially overlap said cutouts of another of said patterned sheet members, so that a plurality of mutually spaced-apart voids are defined by overlapping portions of said cutouts of said one patterned sheet member and said another patterned sheet member, said patterned sheet members having respective areas at which the sheet members are superposed on each other, at least a part of the area of at least one of said patterned sheet members including a thin-walled portion whose thickness is smaller than a thickness of the other portion of said at least one patterned sheet member.

9. A patterned structure according to claim 8, wherein each of said patterned sheet members has an etched portion as said thin-walled portion, and a plurality of non-etched portions as said other portion, each of said non-etched portions of one of said patterned sheet member being fitted in said plurality of cutouts of another of said patterned sheet members, respectively, such that said voids are left in said overlapping portions of said cutouts of said one patterned sheet member and said another patterned sheet member.

10. A patterned structure according to claim 8, wherein each of said plurality of cutouts is a rectangular cutout, and each of said voids is a rectangular void.

* * * * *